(12) United States Patent
Burnley et al.

(10) Patent No.: US 7,092,865 B1
(45) Date of Patent: Aug. 15, 2006

(54) METHOD AND APPARATUS FOR TIMING MODELING

(75) Inventors: Richard P. Burnley, Mountain View, CA (US); Shizuka Oda, San Leandro, CA (US); Andy H. Gan, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 749 days.

(21) Appl. No.: 10/241,496

(22) Filed: Sep. 10, 2002

(51) Int. Cl.
*G06F 17/50* (2006.01)
*G06F 9/45* (2006.01)

(52) U.S. Cl. .................. 703/14; 703/2; 716/6; 716/17; 326/38

(58) Field of Classification Search .................... 703/2, 703/14, 19; 716/1–21; 326/38
See application file for complete search history.

(56) References Cited

U.S. PATENT DOCUMENTS

| | | |
|---|---|---|
| 4,758,985 A | 7/1988 | Carter |
| 4,855,669 A | 8/1989 | Mahoney |
| 5,072,418 A | 12/1991 | Boutaud et al. |
| 5,142,625 A | 8/1992 | Nakai |
| RE34,363 E | 8/1993 | Freeman |
| 5,274,570 A | 12/1993 | Izumi et al. |
| 5,311,114 A | 5/1994 | Sambamurthy et al. |
| 5,339,262 A | 8/1994 | Rostoker et al. |
| 5,347,181 A | 9/1994 | Ashby et al. |
| 5,361,373 A | 11/1994 | Gilson |
| 5,457,410 A | 10/1995 | Ting |
| 5,473,267 A | 12/1995 | Stansfield |
| 5,500,943 A | 3/1996 | Ho et al. |
| 5,504,738 A | 4/1996 | Sambamurthy et al. |
| 5,537,601 A | 7/1996 | Kimura et al. |
| 5,543,640 A | 8/1996 | Sutherland et al. |
| 5,550,782 A | 8/1996 | Cliff et al. |
| 5,552,722 A | 9/1996 | Kean |
| 5,574,930 A | 11/1996 | Halverson, Jr. et al. |
| 5,574,942 A | 11/1996 | Colwell et al. |
| 5,581,745 A | 12/1996 | Muraoka |
| 5,600,845 A | 2/1997 | Gilson |
| 5,652,904 A | 7/1997 | Trimberger |
| 5,671,355 A | 9/1997 | Collins |
| 5,705,938 A | 1/1998 | Kean |
| 5,732,250 A | 3/1998 | Bates et al. |
| 5,737,631 A | 4/1998 | Trimberger |
| 5,740,404 A | 4/1998 | Baji |

(Continued)

FOREIGN PATENT DOCUMENTS

EP 0315275 A2 10/1989

(Continued)

OTHER PUBLICATIONS

Sayfe Kiaei et al., "VLSI Design of Dynamically Reconfigurable Array Processor-Drap," IEEE, Feb. 1989, pp. 2484-2488, V3.6, IEEE, 3 Park Avenue, 17th Floor, New York, NY 10016-5997.

(Continued)

*Primary Examiner*—Thai Phan
(74) *Attorney, Agent, or Firm*—W. Eric Webostad

(57) ABSTRACT

Method and apparatus for timing modeling is described. More particularly, sub-processes for obtaining timing information are described. Each of these sub-process is limited to a portion of a gasket module for coupling an embedded device to a host device, and each of these sub-process may be limited to a lithographic process dimension or adjusted accordingly. By dividing timing information gathering into sub-process, output from each of the sub-process may be combined with timing information provided with an embedded core to determine path delays.

31 Claims, 6 Drawing Sheets

U.S. PATENT DOCUMENTS

| | | | |
|---|---|---|---|
| 5,742,179 | A | 4/1998 | Sasaki |
| 5,742,180 | A | 4/1998 | DeHon et al. |
| 5,748,979 | A | 5/1998 | Trimberger |
| 5,752,035 | A | 5/1998 | Trimberger |
| 5,760,607 | A | 6/1998 | Leeds et al. |
| 5,809,517 | A | 9/1998 | Shimura |
| 5,835,405 | A | 11/1998 | Tsui et al. |
| 5,874,834 | A | 2/1999 | New |
| 5,889,788 | A | 3/1999 | Pressly et al. |
| 5,892,961 | A | 4/1999 | Trimberger |
| 5,914,616 | A | 6/1999 | Young et al. |
| 5,914,902 | A | 6/1999 | Lawrence et al. |
| 5,933,023 | A | 8/1999 | Young |
| 5,970,254 | A | 10/1999 | Cooke et al. |
| 6,011,407 | A | 1/2000 | New |
| 6,020,755 | A | 2/2000 | Andrews et al. |
| 6,026,481 | A | 2/2000 | New et al. |
| 6,096,091 | A | 8/2000 | Hartmann |
| 6,154,051 | A | 11/2000 | Nguyen et al. |
| 6,163,166 | A | 12/2000 | Bielby et al. |
| 6,172,990 | B1 | 1/2001 | Deb et al. |
| 6,178,541 | B1 | 1/2001 | Joly et al. |
| 6,181,163 | B1 | 1/2001 | Agrawal et al. |
| 6,211,697 | B1 | 4/2001 | Lien et al. |
| 6,242,945 | B1 | 6/2001 | New |
| 6,272,451 | B1 | 8/2001 | Mason et al. |
| 6,279,045 | B1 | 8/2001 | Muthujumaraswathy et al. |
| 6,282,627 | B1 | 8/2001 | Wong et al. |
| 6,301,696 | B1 | 10/2001 | Lien et al. |
| 6,343,207 | B1 | 1/2002 | Hessel et al. |
| 6,353,331 | B1 | 3/2002 | Shimanek |
| 6,356,987 | B1 | 3/2002 | Aulas |
| 6,389,558 | B1 | 5/2002 | Herrmann et al. |
| 6,434,735 | B1 | 8/2002 | Watkins |
| 6,460,172 | B1 | 10/2002 | Insenser Farre et al. |
| 6,467,009 | B1 | 10/2002 | Winegarden et al. |
| 6,483,342 | B1 | 11/2002 | Britton et al. |
| 6,507,942 | B1 | 1/2003 | Calderone et al. |
| 6,510,548 | B1 | 1/2003 | Squires |
| 6,518,787 | B1 | 2/2003 | Allegrucci et al. |
| 6,519,753 | B1 | 2/2003 | Ang |
| 6,522,167 | B1 | 2/2003 | Ansari et al. |
| 6,532,572 | B1 | 3/2003 | Tetelbaum |
| 6,539,508 | B1 | 3/2003 | Patrie et al. |
| 6,541,991 | B1 | 4/2003 | Hornchck, et al. |
| 6,578,174 | B1 | 6/2003 | Zizzo |
| 6,587,995 | B1 | 7/2003 | Duboc et al. |
| 6,588,006 | B1 | 7/2003 | Watkins |
| 6,601,227 | B1 | 7/2003 | Trimberger |
| 6,604,228 | B1 | 8/2003 | Patel et al. |
| 6,611,951 | B1 | 8/2003 | Tetelbaum et al. |
| 6,934,922 | B1 * | 8/2005 | Burnley ..................... 716/6 |
| 2001/0049813 | A1 | 12/2001 | Chan et al. |
| 2003/0062922 | A1 | 4/2003 | Douglass et al. |

FOREIGN PATENT DOCUMENTS

| | | |
|---|---|---|
| EP | 0 905 906 A2 | 3/1999 |
| EP | 1 235 351 A1 | 8/2002 |
| WO | WO 93 25968 A1 | 12/1993 |

OTHER PUBLICATIONS

Vason P. Srini, "Field Programmable Gate Array (FPGA) Implementation of Digital Systems: An Alternative to ASIC," IEEE, May 1991, pp. 309-314, IEEE, 3 Park Avenue, 17th Floor, New York, NY 10016-5997.

G. Maki et al., "A Reconfigurable Data Path Processor," IEEE, Aug. 1991, pp. 18-4.1 to 18-4.4, IEEE, 3 Park Avenue, 17th Floor, New York, NY 10016-5997.

Jacob Davidson, "FPGA Implementation of Reconfigurable Microprocessor," IEEE, Mar. 1993, pp. 3.2.1-3.2.4, IEEE, 3 Park Avenue, 17th Floor, New York, NY 10016-5997.

Christian Iseli et al., "Beyond Superscaler Using FPGA's," IEEE, Apr. 1993, pp. 486-490, IEEE, 3 Park Avenue, 17th Floor, New York, NY 10016-5997.

P.C. French et al.,"A Self-Reconfiguring Processor,"; IEEE, Jul. 1993, pp. 50-59, IEEE, 3 Park Avenue, 17th Floor, New York, NY 10016-5997.

Christian Iseli et al., "Spyder: A Reconfigurable VLIW Processor Using FPGA's," IEEE, Jul. 1993, pp. 17-24, IEEE, 3 Park Avenue, 17th Floor, New York, NY 10016-5997.

Michael J. Wirthlin et al., "The Nano Processor: A Low Resource Reconfigurable Processor," IEEE, Feb. 1994, pp. 23-30, IEEE, 3 Park Avenue, 17th Floor, New York, NY 10016-5997.

William S. Carter, "The Future of Programmable Logic and Its Impact on Digital System Design," Apr. 1994, IEEE, pp. 10-16, IEEE, 3 Park Avenue, 17th Floor, New York, NY 10016-5997.

Andre' Dehon, "DPGA-Coupled Microprocessors: Commodity ICs for the Early 21st Century,"IEEE, Feb. 1994, pp. 31-39, IEEE, 3 Park Avenue, 17th Floor, New York, NY, 10016-5997.

Osama T. Albaharna, "Area & Time Limitations of FPGA-Based Virtual Hardware," IEEE, Apr. 1994, pp. 184-189, IEEE, 3 Park Avenue, 17th Floor, New York, NY 10016-5997.

Xilinx, Inc., "The Programmable Logic Data Book," 1994, Revised 1995, Xilinx, Inc., 2100 Logic Drive, San Jose, CA. 95124.

Xilinx, Inc., "The Programmable Logic Data Book," 1994, Revised 1995, pp. 2-109 to 2-117, Xilinx, Inc., 2100 Logic Drive, San Jose, CA. 95124.

Xilinx, Inc., "The Programmable Logic Data Book," 1994, Revised 1995, pp. 2-9 to 2-18; 2-187 to 2-199, Xilinx, Inc., 2100 Logic Drive, San Jose, CA 95124.

Xilinx, Inc., "The Programmable Data Book," 1994, Revised 1995, pp. 2-107 to 2-108, Xilinx, Inc., 2100 Logic Drive, San Jose, CA. 95124.

Christian Iseli et al., "AC++ Compiler for FPGA Custom Execution Units Synthesis," 1995, pp. 173-179, IEEE, 3 Park Avenue, 17th Floor, New York, NY 10016-5997.

International Business Machines, "PowerPC 405 Embedded Processor Core User Manual," 1996, 5th Ed., pp. 1-1 To X-16, International Business Machines, 1580 Rout 52, Bldg. 504, Hopewell Junction, NY 12533-6531.

Yamin Li et al., "AIZUP-A Pipelined Processor Design & Implementation on Xilinx FPGA Chip," IEEE, Sep. 1996, pp. 98-106, 98-106, IEEE, 3 Park Avenue, 17th Floor, New York, NY 10016-5997.

Ralph D. Wittig et al., Onechip: An FPGA Processor With Reconfigurable Logic, Apr. 17, 1996, pp. 126-135, IEEE, 3 Park Avenue, New York, NY 10016-5997.

Xilinx, Inc., "The Programmable Logic Data Book," Jan. 27, 1999, Ch. 3, pp. 3-1 to 3-50, Xilinx, Inc., 2100 Logic Drive, San Jose, CA 95124.

William B. Andrew et al., "A Field Programmable System Chip Which Combines FPGA & ASIC Circuitry," IEEE, May 16, 1999, pp. 183-186, IEEE, 3 Park Avenue, 17th Floor, New York, NY 10016-5997.

Xilinx, Inc., "The Programmable Logic Data Book," 2000, Ch. 3 pp. 3-1 to 3-117, Xilinx, Inc., 2100 Logic Drive, San Jose, CA 95124.

Xilinx, Inc., "The Programmable Logic Book," 2000, Ch 3, pp. 3-7 to 3-17; 3-76 to 3-87, Xilinx, Inc., 2100 Logic Drive, San Jose, CA. 95124.

International Business Machines, "Processor Local Bus" Architecture Specifications, 32-Bit Implementation, Apr. 2000, First Edition, V2.9, pp. 1-76, IBM Corporation, Department H83A, P.O. Box 12195, Research Triangle Park, NC 27709.

Xilinx, Inc., Virtex II Platform FPGA Handbook, Dec. 6, 2000, v1.1, pp. 33-75, Xilinx, Inc., 2100 Logic Drive, San Jose, CA. 95124.

Cary D. Snyder et al., "Xilinx's A-to-Z System Platform," Cahners Microprocessor Report, Feb. 26, 2001, pp. 1-5, Microdesign Resources, www.MDRonline.com, 408-328-3900.

U.S. Appl. No. 09/858,732, filed May 15, 2001, Schulz.

U.S. Appl. No. 09/861,112, filed May 18, 2001, Dao et al.

U.S. Appl. No. 09/917,304, filed Jul. 27, 2001, Douglass et al.
U.S. Appl. No. 09/968,446, filed Sep. 28, 2001, Douglass et al.
U.S. Appl. No. 09/991,410, filed Nov. 16, 2001, Herron et al.
U.S. Appl. No. 09/991,412, filed Nov. 16, 2001, Herron et al.

U.S. Appl. No. 10/001,871, filed Nov. 19, 2001, Douglass et al.
U.S. Appl. No. 10/043,769, filed Jan. 9, 2002, Schulz.

* cited by examiner

METHOD AND APPARATUS FOR TIMING MODELING

FIELD OF THE INVENTION

The present invention relates generally to timing modeling, and more particularly to timing modeling for a gasket module for coupling a core embedded in a programmable logic device.

BACKGROUND OF THE INVENTION

Programmable logic devices exist as a well-known type of integrated circuit that may be programmed by a user to perform specified logic functions. There are different types of programmable logic devices, such as programmable logic arrays (PLAs) and complex programmable logic devices CPLDs). One type of programmable logic devices, called a field programmable gate array (FPGA), is very popular because of a superior combination of capacity, flexibility, time to market and cost.

An FPGA typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBs, IOBs, and interconnect structure are configured. The configuration bitstream may be read from an external memory, conventionally an external integrated circuit memory EEPROM, EPROM, PROM, and the like, though other types of memory may be used. The collective states of the individual memory cells then determine the function of the FPGA.

The process for producing an integrated circuit comprises many steps. Conventionally, a logic design is followed by a circuit design, which is followed by a layout design. With respect to the circuit design and layout portion, once circuits for an integrated circuit have been designed, such designs are converted to a physical representation known as a "circuit layout" or "layout." Layout is exceptionally important to developing a working design as it affects many aspects, including, but not limited to, signal noise, signal time delay, resistance, cell area, and parasitic effect.

Once a circuit is designed and laid out, it is often simulated to ensure performance criteria are met, including, but not limited to, signal timing. This type of analysis is difficult at the outset, and is made more difficult by an embedded design. An embedded design or embedded circuit is conventionally designed separately from an integrated circuit in which it is embedded. Sometimes this embedded circuit is referred to an intellectual property (IP) core or embedded core. This is because the information to build and test such an embedded circuit is provided from one company to another.

An IP core may have a certain maximum timing performance for input and output. For example, a microprocessor will have certain maximum timing performance for input and output of data and other information. However, there is no de facto standard bus interface for an embedded device. Accordingly, glue or gasket logic and interconnects are used to couple an embedded device to a host device, such as a programmable logic device.

For an embedded core in an integrated circuit, such as an FPGA with an embedded microprocessor core, a portion of the integrated circuit is reserved for the embedded core and gasket/glue logic. In this reserved area, interconnects and gasket logic may be used to couple an embedded core to a host integrated circuit. Moreover, modules from a host integrated circuit may be used for this coupling. However, layout for an embedded device and a host device may be for different layout databases.

Accordingly, it would be desirable and useful to provide means to automate gathering of gasket timing information from dissimilar layouts databases, and more particularly to provide a self-contained timing model capable of accommodating different layout databases with different process technologies.

SUMMARY OF THE INVENTION

The present invention provides sub-processes for obtaining timing information. Each of these sub-process is limited to a portion of a gasket module for coupling a host device to an embedded device, and each of these sub-processes may be limited to a lithographic process or accordingly adjusted. By dividing timing information gathering into sub-process, output from each of the sub-process may be combined with timing information provided with an embedded core to determine path delays.

An aspect of the present invention is a timing modeling process for coupling different integrated circuit devices. Gasket timing information is obtained from gasket wiring and logic for coupling the different integrated circuits. Module timing information is obtained from modules for coupling the different integrated circuits. Core device timing information is obtained for one of the different integrated circuits. The gasket timing information, the module timing information and the core device timing information is assembled for respective signal paths. Another aspect of the present invention is a computer-readable medium having information stored thereon computer-executable instructions for performing a method for the timing modeling process.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

DETAILED DESCRIPTION OF THE DRAWINGS

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
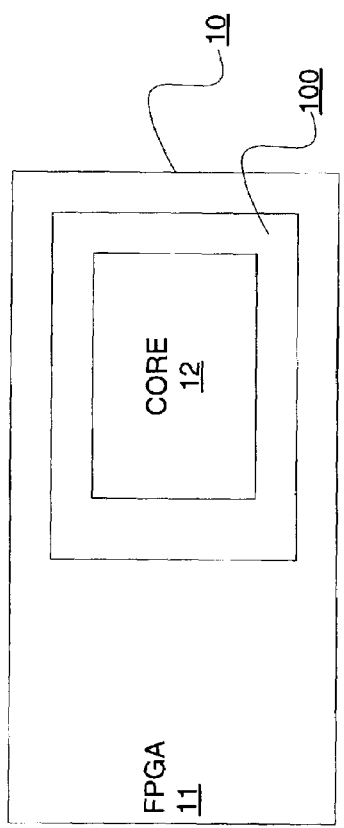
FIG. 1 is a block diagram of an exemplary embodiment of an integrated circuit in accordance with one or more aspects of the present invention.

Referring to FIG. 1, there is shown a block diagram of an exemplary embodiment of an integrated circuit 10 in accordance with one or more aspects of the present invention. Integrated circuit 10 comprises a host device 11, a gasket module 100 and an embedded device 12. Gasket module 100 is for coupling embedded device 12 and host device 11. Examples of embedded device 12 include, but are not limited to, one or more microprocessors, microcontrollers, and digital signal processors, and examples of host device 11 include, but are not limited to, CPLDs, FPGAs and the like. Gasket module 100 comprises interconnects, discrete logic components—including, but not limited to, standard cells. Moreover, gasket module 100 may comprise on-chip memory controllers as sub-modules.

Figure 2:
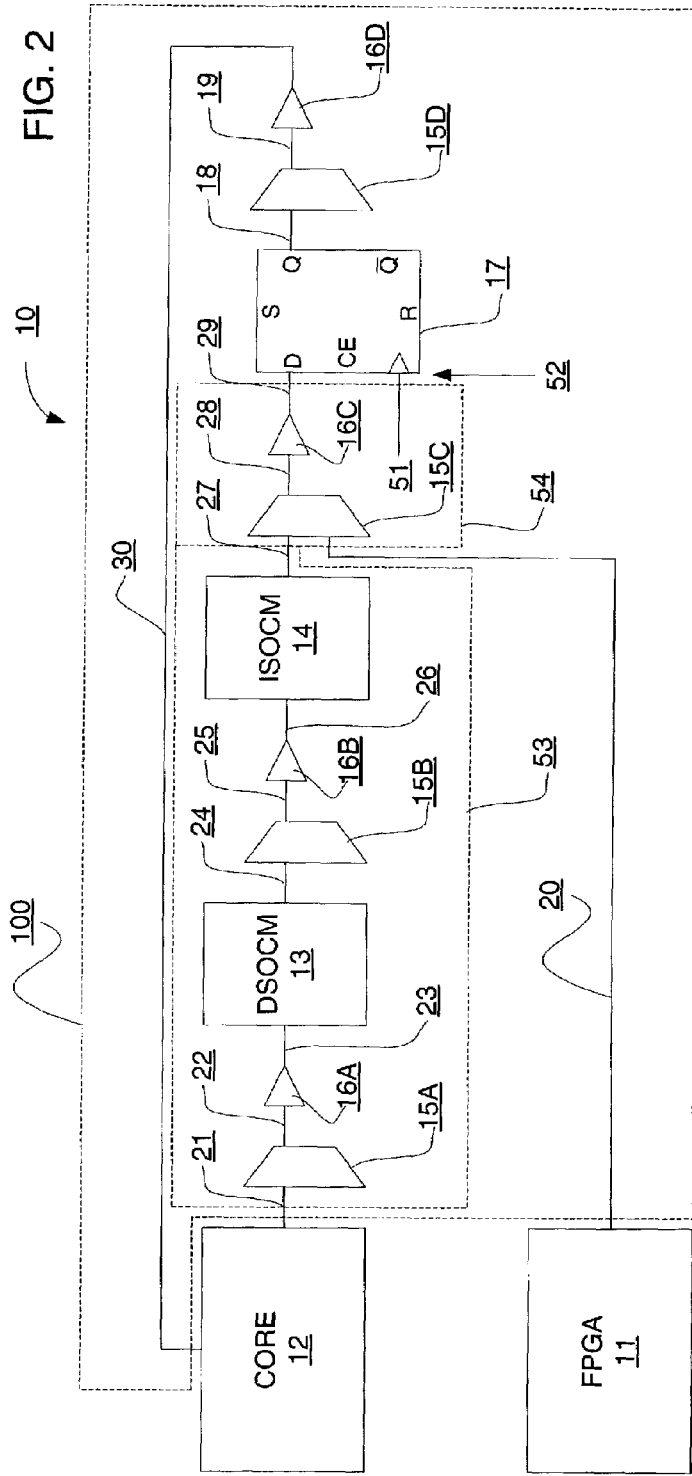
FIG. 2 is schematic/block diagram of an exemplary portion of an embodiment of the integrated circuit of FIG. 1.

FIG. 2 is schematic/block diagram of an exemplary portion of an embodiment of the integrated circuit of FIG. 1. In order to have an accurate timing model, delays for discrete logic elements, interconnects and sub-modules need to be considered. To do timing analysis, this timing model needs to be able to absorb data timing, including setup times, as well as hold times, clock-to-output times and combinatorial delays.

However, acquiring such timing information for analysis is a non-trivial matter, especially when host device 11 and embedded core 12 are laid out with different databases. Suppose, for example, FPGA 11 has a critical timing signal path from output of FPGA 11 to input of delay flip-flop ("D-FF")17. D-FF 17 has a clock signal input for clock signal 51, where clock signal 51 is a data clock signal. Rather than slowing clock signal 51, it would be desirable to ensure data arrived at a boundary 52 within a setup time and with enough margin for a hold time for processing such data with D-FF 17.

Thus, delays for interconnects 20, 21, 22, 23, 24, 25, 26, 27, 28 and 29 ("21 through 29") will need to be determined. However, these delays will be subject to physical layout and routing. Additionally, delays for discrete logic, such as for example multiplexers ("MUXs") and buffers 15A, 16A, 15B, 16B, 15C and 16C ("15 and 16") will need to be determined. Additionally, clock-to-output delays and input setup times for sub-modules 13 and 14 will need to be determined. For example, sub-module 13 may be a data-side on-chip memory controller ("DSOCM"), and sub-module 14 may be an instruction-side on-chip memory controller ("ISOCM"). Assuming positive or rising edge clock triggering, clock-to-rising edge and clock-to-falling edge of output may be used as conventions for timing information. Also, it will be assumed that the goal is to not have any latency, namely, to operated D-FF 17 off of single cycles of clock signal 51 for setup and hold times.

From boundary 52 to embedded core 12, clock-to-output delay for D-FF 17 will need to be determined. Additionally, delays for interconnects 18, 19 and 30, MUX 15D, and buffer 16D will have to be determined.

Figure 3:
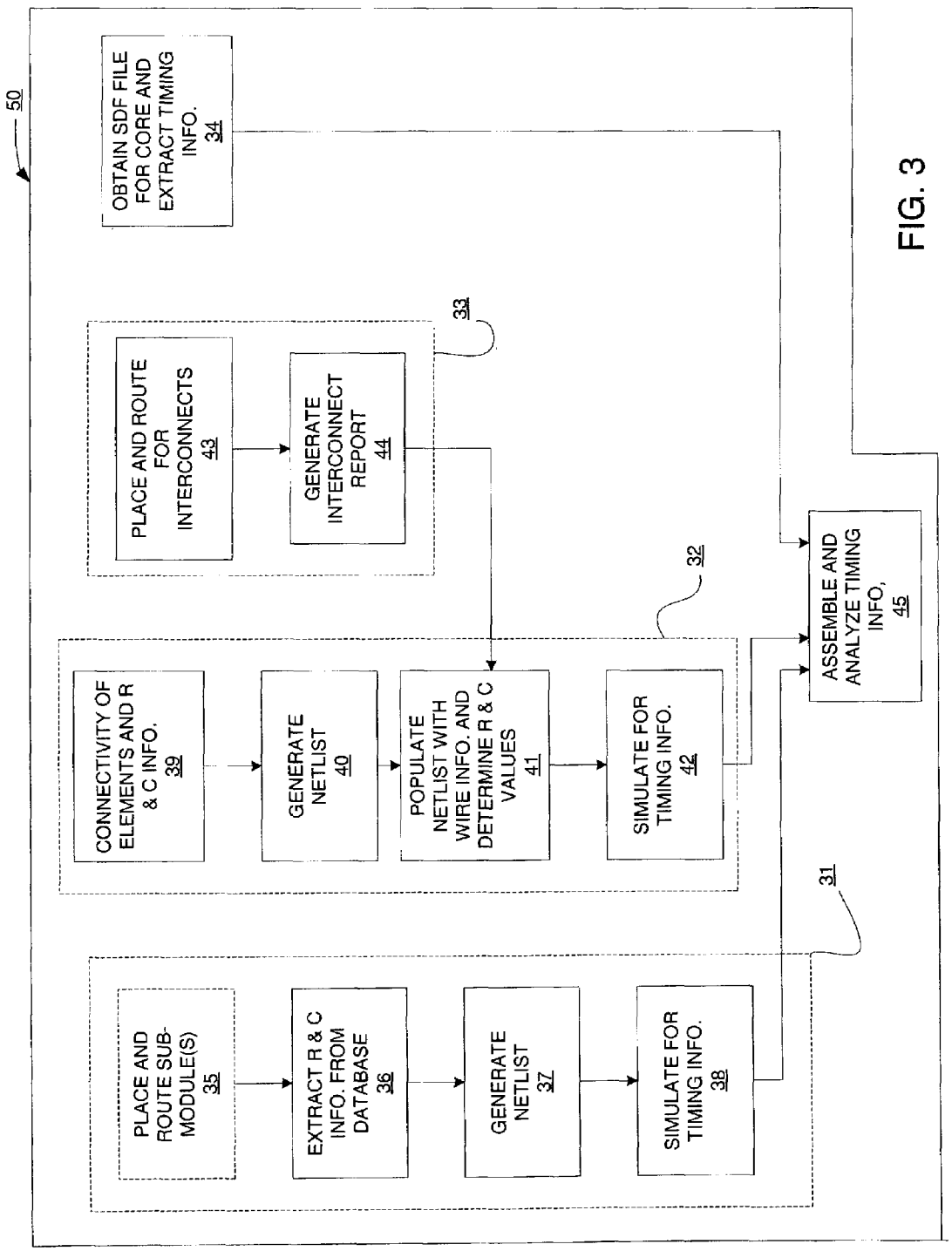
FIG. 3 is a process flow diagram of an exemplary embodiment of a timing modeling process in accordance with one or more aspects of the present invention.

FIG. 3 is a process flow diagram of an exemplary embodiment of a timing modeling process 50 in accordance with one or more aspects of the present invention. Timing modeling process 50 comprises sub-module timing modeling sub-process ("sub-process") 31, gasket logic and interconnect timing modeling sub-process ("sub-process") 32, interconnect timing modeling sub-process ("sub-process") 33, obtain embedded core timing information step 34, and assemble and analyze timing information step 45.

Sub-process 31 is for obtaining timing delays for sub-modules of gasket module 100. In particular, some examples of sub-modules include DSOCM 13 and ISOCM 14, though other sub-modules may be used. At step 35, placement and routing of sub-modules and logic components forming sub-modules is done using a place and route tool. From step 35, a database is generated with sub-module information. Continuing the above example, DSOCM 13 and ISOCM 14 may be part of an FPGA fabric formed using a lithographic dimensional process. Thus, this database will be for such a lithographic dimensional process. For example, a lithographic dimensional process may be a sub-quarter micron process.

A database for host device 11 at one time expressed with a circuit simulation language, is conventionally converted to a physical layout database. This physical layout database may be processed to provide a binary file known as a "GDS" file. A parasitic extraction tool may be used to extract resistance, capacitance and any associated transistor level information ("electrical property information") for sub-modules at step 36. Parasitic extraction programs or tools are well known, and thus unnecessary detail regarding such tools is not provided herein.

In response to obtaining electrical property information for at least one sub-module at step 36, a network list ("netlist") or more particularly a backannotated SPICE netlist, is generated at step 37. A netlist, or more particularly a SPICE netlist, is generated in accordance with conventions and rules for a tool used to process such a netlist. SPICE netlists in particular are well known, and thus unnecessary detail regarding such netlists is not provided herein.

At step 38, timing simulation is done for sub-modules in response to a netlist generated at step 37. In other words, sub-module operation is simulated to obtain sub-module timing information in response to electrical property information obtained for one or more sub-models. This simulation may be done with a device level circuit simulator tool, such as PathMill from Synopsis of Mountain View, Calif., or other known timing analysis simulator.

Sub-module timing information output from step 38 is provided for assembly with other timing information at step 45. Such assembly of information may be broken out into respective paths, namely, to obtain all delays for a path, as described below in more detail for other portions of timing modeling process 50. Information processing and analysis at step 45 may use a spreadsheet, a database and the like.

Referring again to FIG. 2, section or path 53 delays would not be added to path 20 delay, but rather the longer time of the two likely would be used. However, path 54 delay would be added to time from the longer delay as between paths 53 and 20 to determine boundary 52 timing to input of D-FF 17. Thus, core/host-to-signal timing boundary time may be determined, and thus compared with a single clock cycle time of clock signal 51 to see if setup and hold timing is met.

For example, if such timing is not met, then one or more of signal paths 20, 53 and 54 may be identified for delay reduction modification.

Again, referring to FIG. 3, sub-process 32 is for obtaining timing delays for at least a portion of gasket logic interconnects of gasket module 100. At step 39, connectivity relationship information between logic elements is obtained. For example, connectivity information for MUXs 15 and buffers 16, or other portion of gasket module 100 may be obtained. Notably, many other well-known types of logic elements may be used. So, for example, with respect to an FPGA, a device control register (DCR) interface and a processor local bus (PLB) interface may be expressed as schematics of gasket logic. In other words, a schematic of DCR function is created for example, from which a netlist may be generated with a captured wire report according to such a schematic.

Whereas, host sub-modules are conventionally accessed from a binary file, namely, a physical layout GDS file, as host device 11 has previously been manufactured without embedded device 12, logic elements and interconnects of a gasket module may not be available as a binary file. In other words, logic and interconnect timing information needs to be generated to determine if an embedded device may be embedded within a desired clock cycle time, and thus integrated circuit 10 is presumed to be in a pre-tapeout stage. Moreover, gasket logic elements, including interconnects and discrete circuit elements, may be for a same or a different lithography than that used for host device 11, even though both may be sub-quarter micron processes. Accordingly, prior to step 39, gasket logic may be captured from a schematic or "database" expressed by a circuit simulation language, such as VHDL, Verilog and the like from which a network list ("netlist") comprising connectivity information for such gasket logic is obtained.

A parasitic extraction tool may be used to extract resistance, capacitance and any associated transistor level information ("electrical property information") for at least a portion of gasket logic and interconnects at step 39. Parasitic extraction programs or tools are well known, and thus unnecessary detail regarding such tools is not provided herein. A wire-line model may be used to model interconnects to obtain resistance and capacitance values. Moreover, a same or different parasitic extraction tool for steps 36 and 39 may be used.

In response to obtaining electrical property information for at least a portion of gasket logic and interconnects at step 39, a netlist for such gasket logic and interconnects is generated at step 40. A netlist is generated in accordance with conventions and rules for a tool used to process such a netlist. Owing to data size, single portions of gasket logic and interconnects may be processed at a time.

Sub-process 33 is for obtaining interconnect lengths for gasket module 100. At step 43, gasket module 100 information, including associated information for core device 12 and host device 11, is provided to a place and route (P&R) program or tool. P&R programs or tools are well known, and thus unnecessary detail regarding such tools is not provided herein. A P&R tool is used to place core integrated circuit 12, sub-modules—such as DSOCM 13 and ISOCM 14, and gasket logic elements—such as D-FF 17, MUXs 15 and buffers 16 in order to route interconnects, such as 18, 19, 20, 21, etc., to and from such placements.

At step 44, an interconnect report is generated in response to output interconnect routing of a P&R tool at step 43. Such an interconnect report comprises lengths for interconnects routed. Moreover, if placement and routing is done with a first lithography; however, actual placement and routing will be done with a second lithography, which is smaller than the first lithography, then a path delay reduction factor may be used. Path delay reduction may be determined in a conventional manner dependent on geometries for the two different lithographies used. Thus, each path length may be effectively reduced using a shrink factor or path length reduction factor.

At step 41, a netlist obtained from step 40 is populated or modified with interconnect information, such as wire lengths, from an interconnect report generated at step 44 in response to interconnects routed at step 43. Continuing the above example of a DCR interface, a netlist is populated with appropriated DCR wirelengths from step 44. These wire lengths are used in combination with electrical property information, capacitance and resistance—including parasitic capacitance and resistance, from a wire-line model. Wire-line models are well known, and thus are not described herein in unnecessary detail. Such a wire-line model may be part of or separate from a parasitic extraction tool.

At step 42, timing simulation is done for sub-modules in response to a netlist generated at step 40 and modified at step 41. In other words, gasket logic operation and interconnect time delay is simulated to obtain gasket logic and interconnect timing information in response to electrical property information obtained for such gasket logic elements and interconnects. This simulation may be done with a device level circuit simulator tool, such as HSpice or other known device or transistor level simulator.

Gasket logic and interconnect timing delay information output from step 42 is provided for assembly with other timing information at step 45. Such assembly of information may be broken out into respective paths, as described above. Notably, the ability to assemble timing information for an interface, such as PLB, DCR, DSOCM, and ISOCM, among other known interfaces, enables determination of clock-to-output, setup/hold or operating frequency limits for that interface. In this manner, creation of a timing model for an embedded core, such as a processor block, among other forms of possible embedded cores, at a gasket boundary, such as an interface to "FPGA fabric," among other types of circuitry, is facilitated. Additionally, determination of operating frequency capability of a gasket module in connection with operation of an embedded core, for example limitations of processor block to OCM interfaces, is facilitated.

Conventionally, embedded core 12 is provided from one entity to another with performance data, including, but not limited to, setup and hold times and clock-to-output times. This performance information may be provided in a known file format, such as Standard Delay Format (SDF) file(s). Accordingly, one or more SDF files for embedded core 12 are obtained at step 34, and timing performance data is extracted from such SDF file(s). Embedded core 12 timing information output from step 34 is provided for assembly with other timing information at step 45. As mentioned above, such assembly of information may be broken out into respective paths, as described above.

Once all delay timing information has been collected for a path, a total delay for such a path may be determined by summing such delays. A total path delay may be added to another total path delay in order to determine a delay from core/host to a signal clock-time boundary.

Wireload and Driver Modeling

Figure 4:
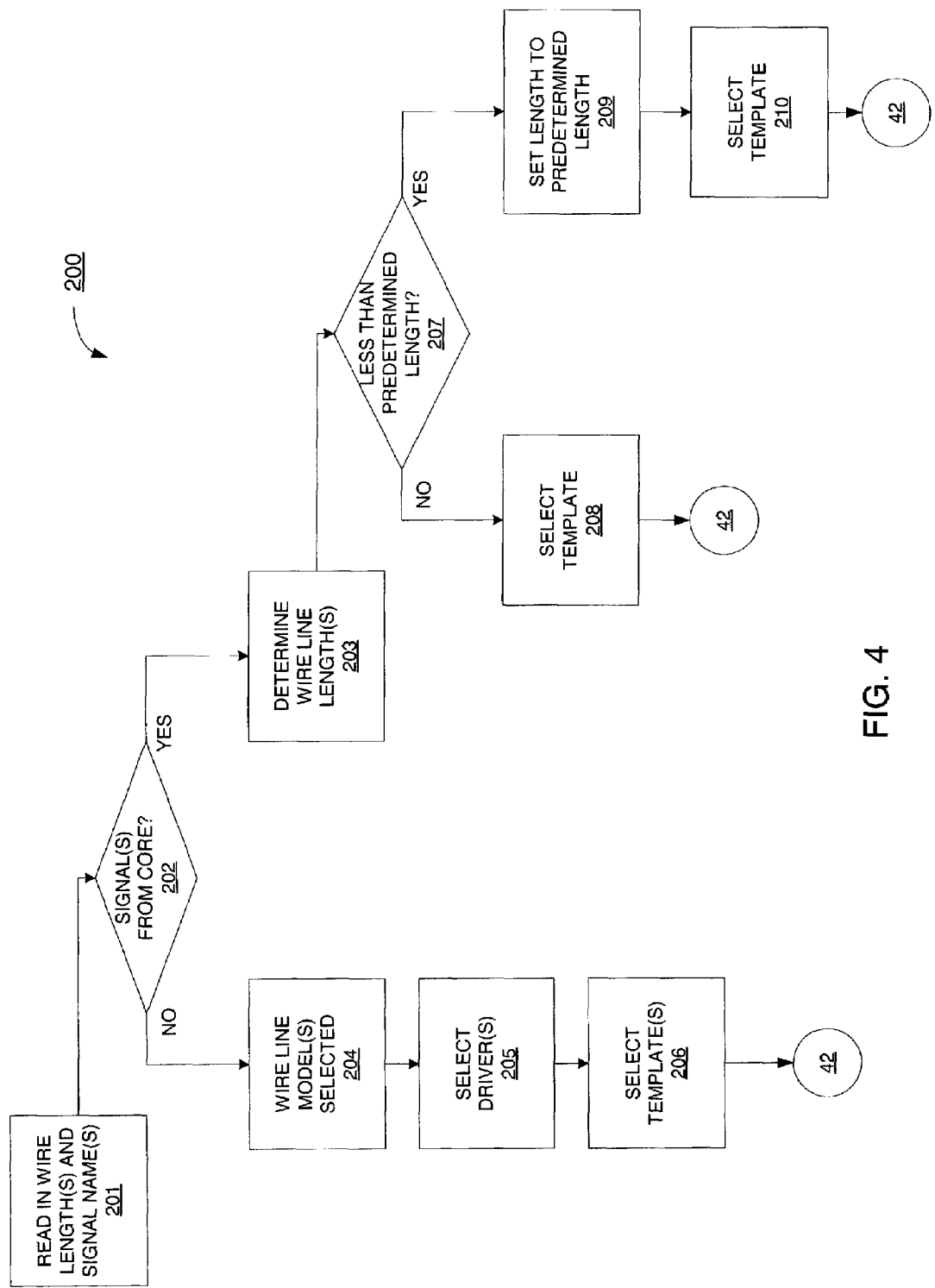
FIG. 4 is a process flow diagram for an exemplary embodiment for a wirelength extraction process in accordance with one or more aspects of the present invention.

Referring to FIG. 4, there is shown a process flow diagram for an exemplary embodiment for a wirelength extraction process 200 in accordance with one or more aspects of the present invention. At step 201, wire length and input/output (I/O) names for gasket logic and connections to and from an embedded core are obtained or otherwise provided to process 200.

At step 202, it is determined for each wire whether it is a signal from an embedded core. Stated another way, for each wire it is determined whether it is to carry communication either from or to an embedded core. Step 202 is to determine which signals from an embedded core need to have a wireload compensation.

If a signal is not from an embedded core, such a signal is provided to an embedded core or gasket logic. Information going to an embedded core may pass through a controller, such as a data or instruction controller, prior to reaching an embedded core.

At step 204, a wire line model is selected for each of such lines for respective wire length. Notably, one model may be used for all conductive lines, or multiple models may be used, as such models may incorporate different physical characteristics, dimensions, material properties and the like, for selected lines corresponding to associated metal layers.

At step 205, a driver is selected according to signal name. A driver may be input by a user, obtained from a lookup table, or otherwise provided.

At step 206, a simulation template netlist ("template") is selected in response to a buffer or driver selected at step 205. Accordingly, it should be appreciated that controllers, such as data and instruction controllers, comprise a plurality of buffers of different sizes. Thus, a simulation template is selected corresponding to a selected buffer. This simulation template may be an HSpice template or other device level simulation tool template. Accordingly, signals originating from other than an embedded core are modeled according to selected driver models.

For signals from an embedded core, at step 203, effective wire length, L, is determined by subtracting from wire length, w1, an amount of wire length, w1', due to capacitive load of a signal from an embedded core. In other words, output pins of an embedded core have an associated capacitance that may be specified. For example, if an output pin of an embedded core is specified as having a 0.25 pico-farad load, this may be converted into an equivalent wire line length dependent on lithographic process. So continuing the example, an equivalent wire line length for a 0.25 pico-farad load may be approximately a 1000 micron wire length for a 0.13 micron (130 nanometers) process. If a gasket module is laid out using a larger lithography, for example a 0.18 micron process interconnect, equivalent wire length is adjusted upwardly, for example to approximately 1500 microns. Actual interconnect delays depend on metal layer dimensions, line spacing and materials, among other well-known factors.

At step 207, a check is made to determine if effective wire length, L, is less than a predetermined number. A clock period associated with signal propagation time is converted to such a predetermine number, namely a wire length. This wire length will then be a maximum wire length allowed for propagation of a signal without slowing clock frequency. For example, if a clock period corresponds to a wire length of 3000 microns, then continuing the above example a check at step 207 would be to determine if L is less than 1500 microns, namely, a maximum wire length minus capacitive load due to an embedded core output pin.

If L is not less than a predetermined number at step 207, in the example L would thus be equal to or greater than 1500 microns, then at step 208 a simulation template is selected in response to L being equal to or greater than such a predetermined number. This simulation template may be an HSpice template or other device level simulation tool template. Notably, conventionally templates are metal layer or conductive level dependent, where different delays may be associated with different metal layers and different lines thereof. Continuing the above example for a 0.25 pf load, if L is greater than or equal to 1500 microns, interconnect delay is too great for a single clock cycle and a more aggressive template may be selected to reduce such a delay for L.

If L is less than a predetermined number at step 207, in the example L would be less than 1500 microns, then at step 209 L is set equal to such a predetermined number.

At step 210, a simulation template is selected in response to L being less than such a predetermined number. Again, this simulation template may be an HSpice template or other device level simulation tool template comprising a wireload model. If L is less than such a predetermined number, then interconnect length is within an acceptable threshold. Accordingly, L may be relaxed by setting it to such a predetermined number, and a template may be selected that is less aggressive with respect to meeting such a delay for L. Output from steps 206, 208 and 210 may be used for a simulation, such as an HSpice simulation at step 42 of FIG. 3 to obtain timing information.

Figure 5:
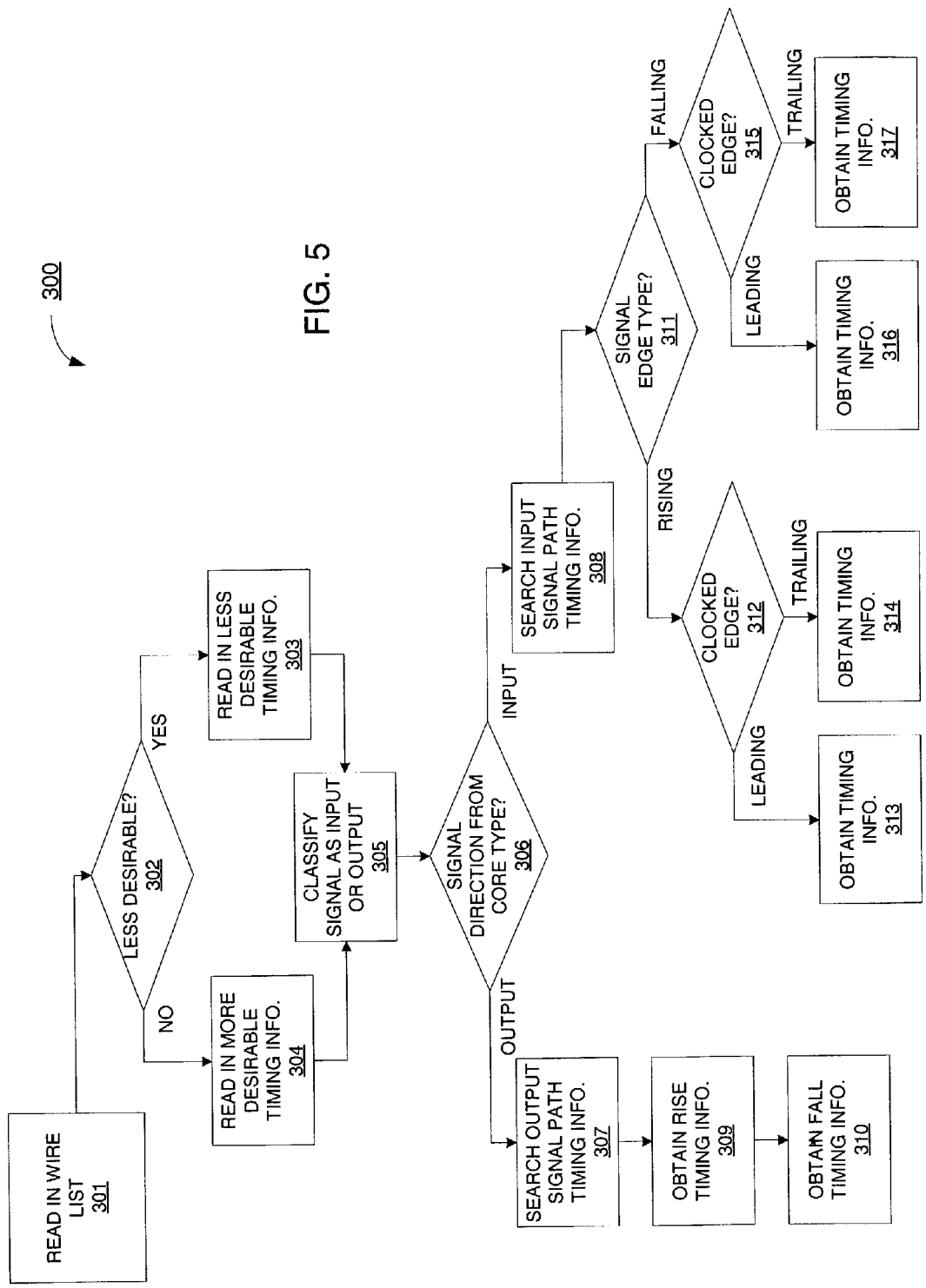
FIG. 5 is a process flow diagram for an exemplary embodiment for a delay information extraction process in accordance with one or more aspects of the present invention.

Referring to FIG. 5, there is shown a process flow diagram for an exemplary embodiment for a delay information extraction process 300 in accordance with one or more aspects of the present invention. Conventionally, an embedded core is provided from a third party with timing information. This timing information may be provided as a plurality of SDF files, where each file represents different operating and transistor conditions. At step 301, a least one wire list is obtained and read. A wire list in this context is a list of input and output signals of an embedded core.

At step 302, it is determined whether timing information associated with each of such signals is for a "less desirable case" condition. For example, it should be understood that different operating conditions may provide different sets of timing information for a same embedded core. Thus, different operating ranges may be classified into one of two groups, namely, "less desirable case" and "more desirable case." Accordingly, different SDF files may represent different operating conditions. Furthermore, more than two groups may be used. For example, groups may be "best case," "typical case" and "worst case." However, for purposes of clarity, a two group embodiment is described from which extending to more or less than two groups will be apparent.

If at step 302 information is from a "less desirable" condition, then at step 303 "less desirable" timing information is read an from SDF file. However, if at step 302, information is not from a "less desirable" condition, then at step 304 "more desirable" or typical timing information is read from an SDF file.

At step 305, it is determined for each signal or each signal is classified as to whether it is an input signal to an embedded core or an output signal from an embedded core.

At step 306, associations as to input and output are determined. This may be done by checking for one signal type. For example, a check may be made to determine if a signal is an input signal at step 306.

Continuing the above example of checking for input signals at step 306, at step 307 a search is made for an output path signal timing, and at step 308 a search is made for a setup/hold signal timing. Output signals are all associated with clock-to-output timing information, and input signals are all associated with setup, or more particularly setup and hold, timing information. So at step 307, timing information from gasket routing for a signal is obtained for each embedded core output signal, and at step 308, timing information from gasket routing for a signal is obtained for each embedded core input signal.

Particular to SDF files, clock-to-output timing information is stored in separate fields, so step 309 is to obtain rising edge input signal timing information, and step 310 is to obtain falling edge signal input timing information. So, assuming triggering on one side of a clock only, for example from a positive of foremost edge, time to a information having a rising edge and a falling edge may be determined. Though, this description is in terms of single edge triggering for purposes of clarity, double data rate may be used as well.

For embedded core input signals, a check is made at step 311 as to which edge is used for triggering. Again, one type of edge trigger, for example rising or leading edge triggering, may be used to determine which signals are falling edge triggered and which are rising edge triggered. Continuing the above example of checking for rising edge triggered signals at step 311, in response to an input signal being a rising edge triggered signal, at step 312 a check is made to determine what edge of a clock such a signal is used for clocking. Again, one type of edge, for example positive or leading edge, may be used to sort signals into positive and negative, or trailing, edge clocked signals. Continuing the above example of checking for positive edge clocked signals at step 312, at step 313 setup and hold timing information for rising signal edge and rising clock edge input signals are selected from an SDF file, and at step 314 setup and hold timing information for rising signal edge and falling clock edge input signals are selected from an SDF file.

Continuing the above example of checking for rising edge triggered signals at step 311, in response to an input signal being a falling edge triggered signal, at step 315 a check is made to determine what edge of a clock such a signal is used for clocking. Again, one type of edge, for example positive edge, may be used to sort signals into positive and negative clocked signals. Continuing the above example of checking for positive edge clocked signals at step 315, at step 316 setup and hold timing information for falling signal edge and rising clock edge input signals are selected from an SDF file, and at step 317 setup and hold timing information for falling signal edge and falling clock edge input signals are selected from an SDF file.

Accordingly, it should be appreciated that timing information, clock-to-out times, and setup and hold times, reflect transistor conditions and operating conditions, including, but not limited to, voltage and temperature. So though all the signals may look the same, they have different numbers associated with them. Moreover, clock-to-output rise and fall times for output signals are parsed from input signals, and input signals are parsed into four groups.

Furthermore, output from steps 313, 314, 316 and 317 may be provided for assembly of timing information at step 45 of FIG. 3. Accordingly, a spread sheet or database may be used for processing such information.

Figure 6:
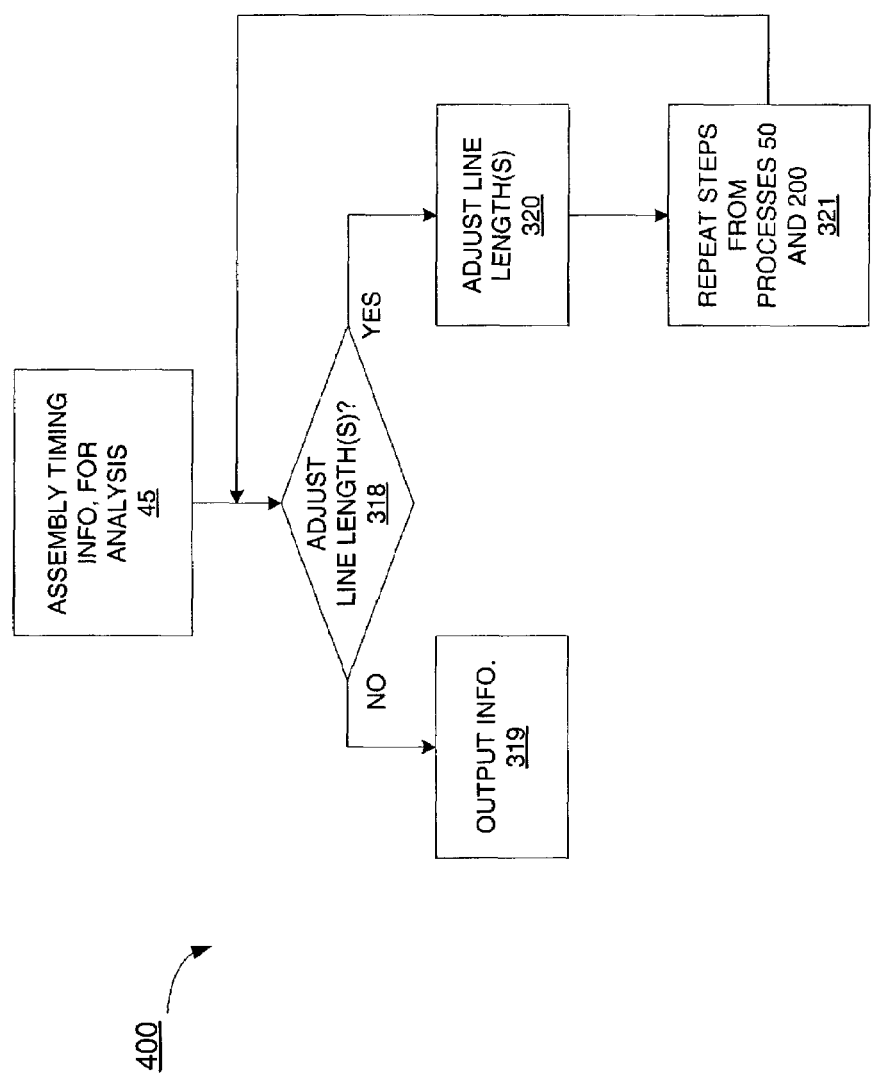
FIG. 6 is a process flow diagram of an exemplary embodiment of a data feedback process in accordance with one or more aspects of the present invention.

Referring to FIG. 6, there is shown a process flow diagram of an exemplary embodiment of a data feedback process 400 in accordance with one or more aspects of the present invention. An initial collection of data is done in accordance with arriving at step 45 of FIG. 3, after which a top or first level timing analysis is done at step 45. This analysis will indicate whether signal propagation for a path is longer or shorter or equal to a defined period of time. This defined period of time may be a single cycle of a clock for an operating frequency. Such an operating frequency may be a highest specified operating frequency for an embedded core.

At step 318, it is determined whether any wire lengths need to be adjusted for a path. In other words, do wires need to be lengthened or shortened to at least meet timing requirements. If no wire lengths need to be adjusted, at step 319, placement, routing and timing information may be outputted. If, however, one or more wire lengths need to be shortened or lengthened or otherwise adjusted, such as by selection of metal layer, then at step 320 such wires are lengthened or shorted to increase or decrease propagation delay, respectively, in response to timing analysis information generated. At step 321, a portion of process 50 may be recalled to repeat steps 42, 44, 41, 42 and 45 to generate revised or re-design data. Moreover, process 200 may be repeated to provide new templates for step 42. In other words, wires are lengthened or shortened resulting in new place and route data output from step 43, which in turn may cause selection of different templates by process 200. Accordingly, new timing information may be output from step 45 for checking for wire length adjustment at step 318 again. This feedback process may continue until timing information is output at step 319 or for a set number of iterations.

Figure 7:
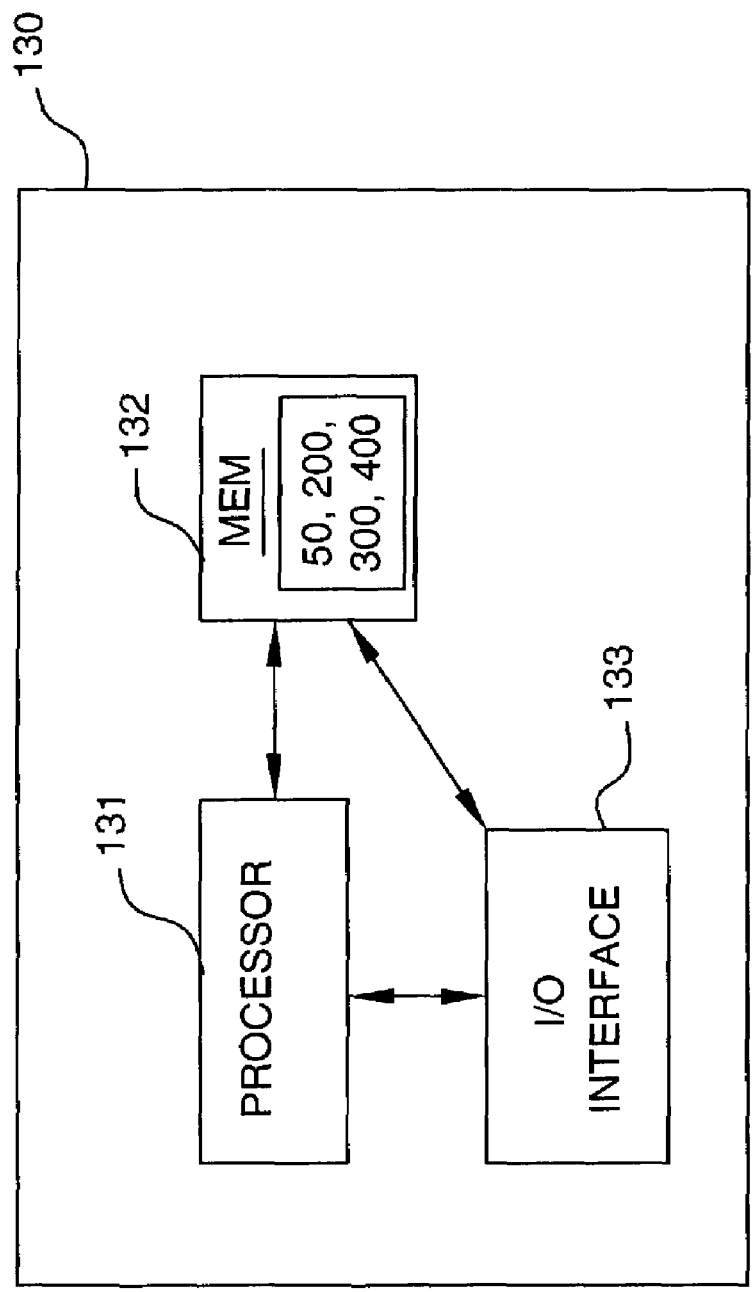
FIG. 7 is a block diagram of a programmed computer system in accordance with one or more aspects of the present invention.

Referring to FIG. 7, there is shown a block diagram of a programmed computer system 130 in accordance with one or more aspects of the present invention. Processor 131 is coupled to memory 132, and I/O interface 133. I/O interface 133 may be coupled to memory 132 as is known for direct memory addressing. Memory 132 may comprise all or a portion of one or more of processes 50, 200, 300 or 400, and one or more associated programs, from time to time.

Embodiments of the present invention may be implemented as program products for use with a computer system 130. The program(s) of the program product defines functions of the embodiments and can be contained on a variety of signal/bearing media, which include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

Although various embodiments which incorporate the teachings of the present invention have been shown and described in detail herein, those skilled in the art can readily devise many other varied embodiments that still incorporate these teachings. Claims listing steps do not imply any order of the steps unless such order is expressly indicated. All trademarks are the property of their respective owners.

The invention claimed is:

1. A timing modeling process for coupling different integrated circuit devices, comprising:

obtaining gasket timing information from gasket wiring and logic for coupling the different integrated circuits, the obtaining of the gasket timing information including:

obtaining wire length information and associated signal name information;

determining whether the wire length information is associated with signaling either to or from a core device;

determining whether to wireload compensate the wire length information responsive to the signaling being from the core device;

obtaining module timing information from modules for coupling the different integrated circuits;

obtaining core device timing information for one of the different integrated circuits; and assembling the gasket timing information, the module timing information and the core device timing information for respective signal paths.

2. The timing modeling process according to claim 1, wherein the step of obtaining the module timing information comprises:

modeling at least one module on a component level to obtain resistance and capacitance values for the at least one module;

generating a network list for the at least one module in response to the resistance and capacitance values obtained; and simulating operation of the at least one module in response to the network list to generate the module timing information for the at least one module.

3. The timing modeling process according to claim 1, wherein the step of obtaining the gasket timing information comprises:

obtaining interconnect information;

modeling the interconnect information to provide associated resistance and capacitance values; and generating a network list in response to the resistance and capacitance values.

4. The timing modeling process according to claim 3, wherein the step of obtaining the gasket timing information comprises:

placing schematic elements associated with the interconnect information;

routing interconnects for coupling the schematic elements; and generating an interconnect report in response to the interconnects routed.

5. The timing modeling process according to claim 4, wherein the obtaining of the wire length information includes obtaining the wire length information from the interconnect report; and wherein the step of obtaining the gasket timing information comprises:

populating the network list with the wire length information of the interconnect report; and simulating the network list populated with the wire length information.

6. A timing modeling process for an embedded device gasket module for coupling an embedded device and a host device, comprising:

providing a first database for the embedded device gasket module, the first database including information on discrete elements for coupling the embedded device to the host device;

placing the discrete elements;

routing interconnects for interconnecting the discrete elements;

generating an interconnect report in response to the interconnects routed;

obtaining interconnect relationship information for interconnecting the discrete elements;

obtaining first resistance and capacitance values for the discrete elements;

generating a first network list in response to the interconnect relationship information obtained;

populating the first network list with wire length information from the interconnect report to provide a second network list;

modeling the wire length information and the interconnects to obtain second resistance and capacitance values;

simulating the discrete elements as interconnected in response to the second network list to generate gasket logic and interconnect timing information;

providing a second database, the second database comprising sub-module information for coupling the embedded device to the host device;

modeling the sub-modules information to obtain third resistance and capacitance values;

generating a third network list for the third resistance and capacitance values obtained;

simulating the sub-modules in response to the third network list to generate sub-module timing information for the sub-modules;

obtaining embedded device timing information for the embedded device; and assembling the gasket logic interconnect timing information, the sub-module timing information and the embedded device timing information for respective signal paths.

7. The timing modeling process according to claim 6, wherein the step of assembling comprises adding delays for each of the respective signal paths to obtain a total delay for each of the respective signal paths.

8. The timing modeling process according to claim 6, wherein the first database is provided from a circuit simulation language description of the embedded device gasket module.

9. The timing modeling process according to claim 6, wherein the second database is provided from a physical layout database of the host device.

10. The timing modeling process according to claim 9, wherein the second database is for a first lithographic dimension, the first lithographic dimension is different from a second lithographic dimension for the embedded device.

11. The timing modeling process according to claim 10, wherein the step of modeling the sub-modules to obtain third resistance and capacitance values comprises applying a shrink factor to provide the third resistance and capacitance values obtained, the shrink factor dependent on the difference between the first lithographic dimension and the second lithographic dimension.

12. The timing modeling process according to claim 11, wherein the core device timing information is obtained from standard data format files.

13. The timing modeling process according to claim 12, wherein the core device timing information comprises setup time information for the embedded device.

14. The timing modeling process according to claim 13, wherein the core device timing information comprises hold time information for the embedded device.

15. The timing modeling process according to claim 12, wherein the core device timing information comprises clock-to-out time information for the embedded device.

16. The timing modeling process according to claim 6, wherein the step of simulating the sub-modules in response to the third network list is done with a static timing analysis computer program.

17. The timing modeling process according to claim 6, wherein the step of simulating the discrete elements and interconnects in response to the second network list is done with a device level circuit simulator computer program.

18. The timing modeling process according to claim 6, wherein the steps of placing the discrete elements, routing interconnects and generating the interconnect report are done with a place and route computer program.

19. The timing modeling process according to claim 18, wherein the interconnect report includes length of each of the interconnects.

20. A computer-readable medium having stored thereon computer-executable instructions for performing a method, the method comprising steps of:
   obtaining gasket timing information from gasket wiring and logic for coupling different integrated circuits, the obtaining of the gasket timing information including:
      obtaining wire length information and associated signal name information;
      determining whether the wire length information is associated with signaling either to or from a core device; and
      determining whether to wireload compensate the wire length information responsive to the signaling being from the core device;
   obtaining module timing information from modules for coupling the different integrated circuits;
   obtaining core device timing information for one of the different integrated circuits; and
   assembling the gasket timing information, the module timing information and the core device timing information for respective signal paths.

21. A computer-readable medium having stored thereon computer-executable instructions for performing a method, the method comprising steps of:
   accessing a first database for an embedded device gasket module, the first database including information on discrete elements for coupling an embedded device to a host device;
   placing the discrete elements;
   routing interconnects for interconnecting the discrete elements;
   generating an interconnect report in response to the interconnects routed;
   obtaining interconnect relationship information for interconnecting the discrete elements;
   obtaining first resistance and capacitance values for the discrete elements;
   generating a first network list in response to the interconnect relationship information obtained;
   populating the first network list with wire length information from the interconnect report to provide a second network list;
   modeling the wire length information and the interconnects to obtain second resistance and capacitance values;
   simulating the discrete elements as interconnected in response to the second network list to generate gasket logic and interconnect timing information;
   accessing a second database, the second database comprising sub-module information for coupling the embedded device to the host device;
   modeling the sub-modules information to obtain third resistance and capacitance values;
   generating a third network list for the third resistance and capacitance values obtained;
   simulating the sub-modules in response to the third network list to generate sub-module timing information for the sub-modules;
   obtaining embedded device timing information for the embedded device; and
   assembling the gasket logic interconnect timing information, the sub-module timing information and the embedded device timing information for respective signal paths.

22. A system for timing modeling and analysis for coupling different integrated circuit devices, comprising:
   a computer, the computer comprising a timing modeling module and a timing analysis module;
   the timing modeling module for:
      obtaining gasket timing information from gasket wiring and logic for coupling the different integrated circuits;
      obtaining module timing information from modules for coupling the different integrated circuits;
      obtaining core device timing information for one of the different integrated circuits;
      assembling the gasket timing information, the module timing information and the core device timing information for respective signal paths;
   the timing analysis module for analyzing the gasket timing information, the module timing information and the core device timing information assembled, wherein the gasket timing information comprises wire length and associated signal name, wherein the timing analysis module is further for:
      obtaining the wire length and the associated signal name from the gasket timing information; and
      determining whether the wire length is for a signal originating from one of the different integrated circuits in response to the associated signal name to determine whether to wireload compensate the wire length.

23. The system according to claim 22, wherein the different integrated circuits are an embedded core in a host integrated circuit.

24. The system according to claim 23, wherein if the wire length is not for carrying the signal originating from the embedded core,
   selecting a wire line model for at least one conductive line associated with the wire length;
   selecting a driver in at least partial response to the wire length; and
   selecting the simulation template in response to the driver selected.

25. The system according to claim 23, wherein if the wire length is for carrying the signal originating from the embedded core,
   determining an adjusted wire length from the wire length;
   determining if the adjusted wire length is less than a predetermined length; and
   selecting the simulation template in response to whether the adjusted wire length is less than the predetermined length.

26. The system according to claim 23, wherein the timing analysis module is further for:
   obtaining a wire list including the wire length;
   selecting a condition from which the wire list was prepared;
   accessing embedded core timing information in response to the condition selected;
   classifying signals including the signal as one of input signals to the embedded core and output signals from the embedded core in response to the wire list; and
   determining whether the signals classified are for an input group or an output group.

27. The system according to claim 26, wherein for the input group, the timing analysis module is configured to search input signal path timing information from the embedded core timing information to obtain rise time information and fall time information.

28. The system according to claim 26, wherein for the output group, the timing analysis module is configured to search output signal path timing information from the embedded core timing information to obtain rise time information and fall time information.

29. The system according to claim 26, wherein for the wire lengths not for carrying the signals originating from the embedded core, the timing analysis module is configured to:
   select wire line models for conductive lines associated with the wire lengths;
   select drivers in at least partial response to the associated signal names; and
   select from a first group of simulation templates in response to the drivers selected.

30. The system according to claim 26, wherein for the wire lengths for carrying the signals originating from the embedded core, the timing analysis module is configured to:
   determine adjusted wire lengths from the wire lengths;
   determine if the adjusted wire lengths are less than a predetermined length;
   select from a second group of simulation templates in response to a first portion of the adjusted wire lengths being less than the predetermined length; and
   select from a third group of simulation templates in response to a second portion of the adjusted wire lengths not being less than the predetermined length.

31. The system according to claim 23, wherein the timing analysis module is further for:
   obtaining wire lengths including the wire length and associated signal names including the signal name from the gasket timing information; and
   determining whether the wire lengths are for signals including the signal originating from the embedded core in response to the associated signal names.

\* \* \* \* \*